US012504687B2

(12) United States Patent
Yamaguchi et al.

(10) Patent No.: US 12,504,687 B2
(45) Date of Patent: Dec. 23, 2025

(54) CURABLE PHOTOSENSITIVE RESIN COMPOSITION, CURED PRODUCT, RESIST PATTERN, METHOD OF PRODUCING RESIST PATTERN, SEMICONDUCTOR DEVICE AND ELECTRONIC DEVICE

(71) Applicant: ARAKAWA CHEMICAL INDUSTRIES, LTD., Osaka (JP)

(72) Inventors: Takashi Yamaguchi, Osaka (JP); Taiyou Nakamura, Osaka (JP); Atsushi Shiotani, Osaka (JP); Keisuke Sugimoto, Osaka (JP); Madoka Yamashita, Osaka (JP); Takashi Tasaki, Osaka (JP)

(73) Assignee: ARAKAWA CHEMICAL INDUSTRIES, LTD., Osaka (JP)

( * ) Notice: Subject to any disclaimer, the term of this patent is extended or adjusted under 35 U.S.C. 154(b) by 568 days.

(21) Appl. No.: 17/954,333

(22) Filed: Sep. 28, 2022

(65) Prior Publication Data

US 2023/0101181 A1    Mar. 30, 2023

(30) Foreign Application Priority Data

Sep. 30, 2021   (JP) .................................. 2021-160323

(51) Int. Cl.
*G03F 7/037* (2006.01)
*C08G 73/10* (2006.01)
*C08L 79/08* (2006.01)

(52) U.S. Cl.
CPC ......... *G03F 7/037* (2013.01); *C08G 73/1039* (2013.01); *C08G 73/1046* (2013.01); *C08L 79/08* (2013.01)

(58) Field of Classification Search
None
See application file for complete search history.

(56) References Cited

U.S. PATENT DOCUMENTS

2019/0049842 A1* 2/2019 Matsukawa ............. G03F 7/004

FOREIGN PATENT DOCUMENTS

| EP | 1087261 A1 * | 3/2001 | ............... H05K 3/06 |
|----|----|----|----|
| JP | 2010256532 | 11/2010 | |
| JP | 2013083958 | 5/2013 | |
| JP | 2013199645 | 10/2013 | |
| JP | 2019020522 | 2/2019 | |
| TW | 201546119 | 12/2015 | |
| TW | 202104374 | 2/2021 | |
| TW | 202122494 | 6/2021 | |
| WO | 2021187355 | 9/2021 | |

OTHER PUBLICATIONS

Machine translation of JP2010-256532, published on Nov. 11, 2010 (Year: 2020).*
"Office Action of Taiwan Counterpart Application", issued on Sep. 27, 2024, with English translation thereof, p. 1-p. 6.
"Office Action of Korea Counterpart Application", issued on Apr. 29, 2025, with English translation thereof, p. 1-p. 7.

* cited by examiner

*Primary Examiner* — Anca Eoff
(74) *Attorney, Agent, or Firm* — JCIPRNET

(57) ABSTRACT

A curable photosensitive resin composition which can be cured at a relatively low temperature, has excellent developability and adhesion to a support, and a cured product that realizes low dielectric constant properties. A curable photosensitive resin composition containing a polyimide resin (A) which is a reaction product of monomer groups containing an aromatic tetracarboxylic anhydride (a1) and a diamine (a2) containing a dimer diamine, maleimides (B), and a polyfunctional polymerizable compound (C) having two or more ethylenic double bonds other than the component (A) and the component (B), a cured product, a photosensitive element, a resist pattern, a method of producing a resist pattern, a semiconductor device and an electronic device.

9 Claims, No Drawings

CURABLE PHOTOSENSITIVE RESIN COMPOSITION, CURED PRODUCT, RESIST PATTERN, METHOD OF PRODUCING RESIST PATTERN, SEMICONDUCTOR DEVICE AND ELECTRONIC DEVICE

CROSS-REFERENCE TO RELATED APPLICATION

This application claims the priority benefit of Japan application serial no. 2021-160323, filed on Sep. 30, 2021. The entirety of the above-mentioned patent application is hereby incorporated by reference herein and made a part of this specification.

BACKGROUND

Technical Field

The disclosure relates to a curable photosensitive resin composition, a cured product, a resist pattern, a method of producing a resist pattern, a semiconductor device and an electronic device.

Description of Related Art

In recent years, high-frequency electrical signals have been used to transmit and process large amounts of information at high speeds but because high-frequency signals are highly likely to attenuate, there is a need to minimize transmission loss as much as possible on the material side, and insulating materials are required to have a low dielectric constant and a low dielectric dissipation factor.

For example, in the related art, for protective films for semiconductor devices, interlayer insulating films formed on the surface layer of semiconductors and insulating films for rewiring layers, photosensitive resin compositions containing polyimide precursors or polybenzoxazole precursors which have excellent heat resistance, electrical properties, adhesion, developability and mechanical properties are used (for example, Patent Document 1, etc.).

However, the photosensitive resin composition containing a polyimide precursor or polybenzoxazole precursor needs to be heated to at least 230° C. or higher in order to cause a dehydration ring-closing reaction when it is cured. In addition, there is a problem of low dielectric constant properties being unlikely to be exhibited (a dielectric constant and/or dielectric dissipation factor are likely to increase) due to high polarity due to the molecular structure and there is a disadvantage in dealing with high-frequency electrical signals.

As materials for improving the curability and low dielectric constant properties (low dielectric constant and low dielectric dissipation factor), for example, the applicant has proposed a polyimide resin obtained by reacting diamines including an aromatic tetracarboxylic acid and a dimer diamine (Patent Document 2), and an adhesive composition containing the resin is applied to a flexible copper-clad laminate plate in which a high-frequency electrical signal is used. However, when the polyimide resin is used as a material of the photosensitive resin composition, the developability may be insufficient depending on the combination.

PATENT DOCUMENTS

[Patent Document 1] Japanese Patent Laid-Open No. 2019-020522
[Patent Document 2] Japanese Patent Laid-Open No. 2013-199645

SUMMARY

The disclosure provides a curable photosensitive resin composition which can be cured at a relatively low temperature, has excellent developability and adhesion to a support, and provides a cured product that realizes low dielectric constant properties.

The inventors conducted extensive studies in order to address the above problems, and found that a composition containing a specific polyimide resin, maleimides and other polymerizable compounds can address the above problem and completed the disclosure. That is, the disclosure relates to the following curable photosensitive resin composition, cured product, resist pattern, method of producing a resist pattern, semiconductor device and electronic device.

1. A curable photosensitive resin composition, including: a polyimide resin (A) which is a reaction product of monomer groups containing an aromatic tetracarboxylic anhydride (a1) and a diamine (a2) containing a dimer diamine; maleimides (B); and a polyfunctional polymerizable compound (C) having two or more ethylenic double bonds other than the component (A) and the component (B).

2. The curable photosensitive resin composition according to Item 1, wherein the component (B) is N,N'-diphenyl-bismaleimides and/or maleimides having a dimer diamine framework.

3. The curable photosensitive resin composition according to Item 1 or 2, wherein the component (C) contains a polymer having a diene framework.

4. The curable photosensitive resin composition according to any one of Items 1 to 3, further including an amine compound (D) other than the component (a2).

5. A cured product of the curable photosensitive resin composition according to any one of Items 1 to 4.

6. A resist pattern having a pattern, wherein the pattern contains the cured product according to Item 5.

7. A method of producing a resist pattern, including:
a process of providing a layer of the cured product according to Item 5 on a support;
a process of emitting active energy rays to at least a part of the layer of the cured product to photo-cure an exposed part; and
a process of removing a part other than the exposed part to form a resist pattern.

8. A method of producing a resist pattern, including a process of providing a layer of the cured product according to Item 5 on a support; and a process of mounting a photoresist on the layer of the cured product to form a pattern and then performing cutting to remove the layer of the cured product, and forming a resist pattern.

9. A semiconductor device comprising the resist pattern according to Item 6.

10. An electronic device comprising the semiconductor device according to Item 9.

The curable photosensitive resin composition (hereinafter simply abbreviated to as a "photosensitive resin composition") of the disclosure can be cured at a relatively low temperature, has excellent developability and adhesion to a support, and provides a cured product that realizes low dielectric constant properties.

DESCRIPTION OF THE EMBODIMENTS

The photosensitive resin composition of the disclosure contains a polyimide resin (A) (hereinafter referred to as a component (A)) which is a reaction product of monomer groups containing an aromatic tetracarboxylic anhydride (a1) (hereinafter referred to as a component (a1)) and a diamine (a2) containing a dimer diamine (hereinafter referred to as a component (a2)), maleimides (B) (hereinafter referred to as a component (B)), and a polyfunctional polymerizable compound (C) having two or more ethylenic double bonds other than the component (A) and the component (B) (hereinafter referred to as a component (C)).

The component (A) is a polyimide resin and is a component used for the cured product to exhibit low dielectric constant properties, excellent heat resistance, and adhesion to a support. In addition, since the polyimide resin is solvent-soluble and has a closed ring structure, the photosensitive resin composition containing the resin can be cured at a relatively low temperature compared to polyamic acid which is a precursor of the polyimide resin.

Examples of components (a1) include 2,2',3,3'-biphenyltetracarboxylic dianhydride, 2,3',3,4'-biphenyltetracarboxylic dianhydride, 3,3',4,4'-biphenyltetracarboxylic dianhydride, pyromellitic dianhydride, 1,2,3,4-benzenetetracarboxylic dianhydride, 3,3',4,4'-diphenylsulfonetetracarboxylic dianhydride, 4,4'-oxydiphthalic dianhydride, 4,4'-[propane-2,2-diylbis(1,4-phenyleneoxy)]diphthalic dianhydride, 2,2',3,3'-benzophenonetetracarboxylic dianhydride, 2,3,3',4'-benzophenonetetracarboxylic dianhydride, 3,3',4,4'-benzophenonetetracarboxylic dianhydride, 2,3',3,4'-diphenyl ether tetracarboxylic dianhydride, bis(2,3-dicarboxyphenyl)ether dianhydride, bis(2,3-dicarboxyphenyl)methane dianhydride, bis(3,4-dicarboxyphenyl)methane dianhydride, 1,1-bis(2,3-dicarboxyphenyl)ethane dianhydride, 1,1-bis(3,4-dicarboxyphenyl)ethane dianhydride, 2,2-bis(2,3-dicarboxyphenyl)propane dianhydride, 2,2-bis(3,4-dicarboxyphenyl)propane dianhydride, bis(2,3-dicarboxyphenoxyphenyl)sulfone dianhydride, bis(3,4-dicarboxyphenoxyphenyl)sulfone dianhydride, 1,4,5,8-naphthalenetetracarboxylic anhydride, 2,3,6,7-naphthalenetetracarboxylic anhydride, 2,3,6,7-anthracenetetracarboxylic dianhydride, 1,2,5,6-naphthalenetetracarboxylic dianhydride, 1,4,5,8-naphthalenetetracarboxylic dianhydride, 2,3,6,7-naphthalenetetracarboxylic dianhydride, 4,8-dimethyl-1,2,3,5,6,7-hexahydronaphthalene-1,2,5,6-tetracarboxylic dianhydride, 2,2-bis(3,4-dicarboxyphenyl)hexafluoropropane dianhydride, and 2,2-bis(3,3',4,4'-tetracarboxyphenyl)tetrafluoropropane dianhydride. These may be used alone or two or more thereof may be used in combination.

Among these, the component (a1) is preferably a component represented by the following General Formula (1) because the component (A) dissolves in an organic solvent and the cured product exhibits excellent heat resistance and adhesion to a support.

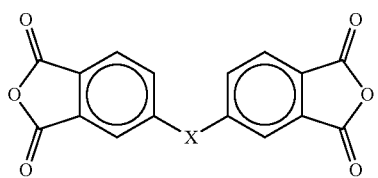

(1)

(in Formula (1), X represents a single bond, —SO$_2$—, —CO—, —O—, —OC$_6$H$_4$—C(CH$_3$)$_2$—C$_6$H$_4$—O—, —C(CH$_3$)$_2$—, —O—C$_6$H$_4$—SO$_2$—C$_6$H$_4$—O—, —C(CHF$_2$)$_2$—, —C(CF$_3$)$_2$—, —COO—(CH$_2$)$_p$—OCO—, or —COO—H$_2$C—HC(—O—C(=O)—CH$_3$)—CH$_2$—OCO—, and p represents an integer of 1 to 20).

Examples of components represented by General Formula (1) include 2,2',3,3'-biphenyltetracarboxylic dianhydride, 3,3',4,4'-biphenyltetracarboxylic dianhydride, 3,3',4,4'-diphenylsulfonetetracarboxylic dianhydride, 3,3',4,4'-benzophenonetetracarboxylic dianhydride, 3,3',4,4'-diphenyl ether tetracarboxylic dianhydride, 2,2-bis(3,4-dicarboxyphenyl)hexafluoropropane dianhydride, 2,2-bis(3,3',4,4'-tetracarboxyphenyl)tetrafluoropropane dianhydride, 4,4'-[propane-2,2-diylbis(1,4-phenyleneoxy)]diphthalic dianhydride, 2,2-bis(2,3-dicarboxyphenyl)propane dianhydride, 2,2-bis(3,4-dicarboxyphenyl)propane dianhydride, and 2,2'-bis(3,4-dicarboxyphenoxyphenyl)sulfone dianhydride. These may be used alone or two or more thereof may be used in combination. Among these, 2,2-bis(3,4-dicarboxyphenyl)hexafluoropropane dianhydride, and 4,4'-[propane-2,2-diylbis(1,4-phenyleneoxy)]diphthalic dianhydride are preferable because the component (A) dissolves well in an organic solvent.

The amount of the component (a1) used in 100 mol % of monomer groups constituting the component (A) is usually 10 to 90 mol %, and preferably 25 to 75 mol %.

In addition, the amount of used tetracarboxylic anhydride represented by General Formula (1) in 100 mol % of monomer groups constituting the component (A) is usually 10 to 90 mol %, and preferably 25 to 75 mol %.

The used amount of the tetracarboxylic anhydride represented by General Formula (1) in 100 mol % of the component (a1) is usually 10 to 100 mol %, and preferably 50 to 100 mol %.

The component (a2) is a diamine including a dimer diamine.

Dimer diamines are obtained by substituting all carboxyl groups of dimer acids with primary amino groups or primary aminomethyl groups (for example, refer to Japanese Patent Laid-Open No. H9-12712). Here, dimer acids mainly include dibasic acids having 36 carbon atoms obtained by dimerizing unsaturated fatty acids such as oleic acid, linoleic acid and linolenic acid, and contain monomer acids having 18 carbon atoms, trimer acids having 54 carbon atoms, and polymerized fatty acids having 20 to 90 carbon atoms depending on the degree of purification. Here, although the dimer acids contain a double bond, the degree of unsaturation may be reduced according to, for example, a hydrogenation reaction.

Examples of the above dimer diamines include those represented by the following General Formula (2). Here, in General Formula (2), m+n=6 to 17 is preferable, p+q=8 to 19 is preferable, and a dashed line indicates a carbon-carbon single bond or a carbon-carbon double bond.

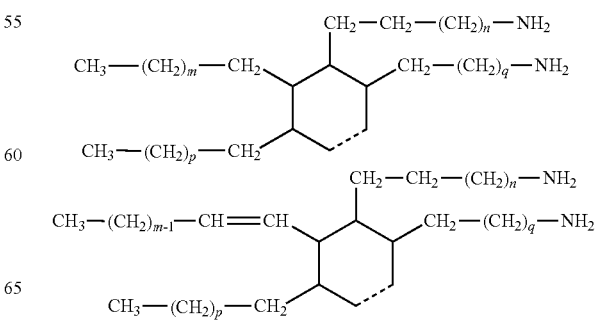

-continued

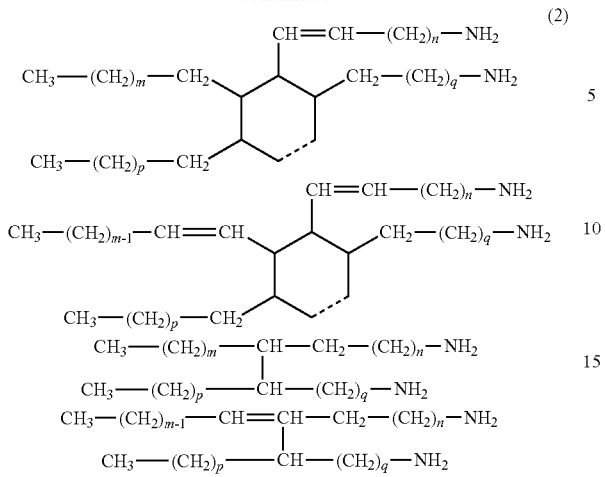

(2)

In addition, examples of commercial dimer diamine products include "Versamine 551," and "Versamine 552" (all commercially available from Cognizant Japan KK), and "PRIAMINE 1073," "PRIAMINE1074," and "PRIAMINE1075" (all commercially available from Croda Japan).

Here, the dimer diamine may contain amines derived from monomer acids, trimer acids and/or polymerized fatty acids, and the content thereof is usually 30 wt % or less in the dimer diamine, and is preferably 10 wt % or less, more preferably 5 wt % or less, still more preferably 3 wt % or less, and particularly preferably 2 wt % or less.

In addition, commercial dimer diamine products may be used without change, and those subjected to a purification treatment such as distillation may be used.

The amount of the dimer diamine used in 100 mol % of monomer groups constituting the component (A) is usually 5 mol % or more, and preferably 25 to 75 mol %.

In addition, the amount of the dimer diamine used in 100 mol % of the component (a2) is usually 10 mol % or more, and preferably 30 to 100 mol %.

In addition, the component (a2) may also include a diamine (a2-1) other than a dimer diamine (hereinafter referred to as a component (a2-1)). The component (a2-1) may include, for example, aliphatic diamines, alicyclic diamines, aromatic diamines, diaminoethers, and diaminopolysiloxanes. Here, these amines exclude dimer diamines.

Examples of aliphatic diamines include ethylene diamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, and 1,12-diaminododecane.

Examples of alicyclic diamines include diaminocyclohexane, diaminodicyclohexylmethane, dimethyldiaminodicyclohexylmethane, diaminodicyclohexylpropane, tetramethyldiaminodicyclohexylmethane, 1,3-bis(aminomethyl)cyclohexane, 1,4-bis(aminomethyl)cyclohexane, diaminobicyclo[2.2.1]heptane, bis(aminomethyl)-bicyclo[2.2.1]heptane, 3(4),8(9)-bis(aminomethyl)tricyclo[5.2.1.0(2,6)]decane, and isophorone diamine.

Examples of aromatic diamines include
diaminobiphenyls such as 2,2'-diaminobiphenyl, 3,3'-diaminobiphenyl, 4,4'-diaminobiphenyl, 2,2'-dimethyl-4,4'-diaminobiphenyl, 2,2'-diethyl-4,4'-diaminobiphenyl, and 2,2'-di-n-propyl-4,4'-diaminobiphenyl;

bisaminophenoxyphenylpropanes such as 2,2-bis[4-(3-aminophenoxy)phenyl]propane, and 2,2-bis[4-(4-aminophenoxy)phenyl]propane;

diaminodiphenyl ethers such as 3,3'-diaminodiphenyl ether, 3,4'-diaminodiphenyl ether, and 4,4'-diaminodiphenyl ether;

phenylene diamines such as p-phenylene diamine and m-phenylene diamine;

diaminodiphenyl sulfides such as 3,3'-diaminodiphenyl sulfide, 3,4'-diaminodiphenyl sulfide, and 4,4'-diaminodiphenyl sulfide;

diaminodiphenyl sulfones such as 3,3'-diaminodiphenyl sulfone, 3,4'-diaminodiphenyl sulfone, and 4,4'-diaminodiphenyl sulfone;

diaminobenzophenones such as 3,3'-diaminobenzophenone, 3,4'-diaminobenzophenone, and 4,4'-diaminobenzophenone;

diaminodiphenylmethanes such as 3,3'-diaminodiphenylmethane, 3,4'-diaminodiphenylmethane, 4,4'-diaminodiphenylmethane, and bis[4-(3-aminophenoxy)phenyl]methane;

diaminophenylpropanes such as 2,2-di(3-aminophenyl)propane, 2,2-di(4-aminophenyl)propane, and 2-(3-aminophenyl)-2-(4-aminophenyl)propane;

diaminophenyl hexafluoropropanes such as 2,2-di(3-aminophenyl)-1,1,1,3,3,3-hexafluoropropane, 2,2-di(4-aminophenyl)-1,1,1,3,3,3-hexafluoropropane, and 2-(3-aminophenyl)-2-(4-aminophenyl)-1,1,1,3,3,3-hexafluoropropane;

diaminophenylphenylethanes such as 1,1-di(3-aminophenyl)-1-phenylethane, 1,1-di(4-aminophenyl)-1-phenylethane, and 1-(3-aminophenyl)-1-(4-aminophenyl))-1-phenylethane;

disaminophenoxybenzenes such as 1,3-bis(3-aminophenoxy)benzene, 1,3-bis(4-aminophenoxy)benzene, 1,4-bis(3-aminophenoxy)benzene, and 1,4-bis(4-aminophenoxy)benzene;

bisaminobenzoylbenzenes such as 1,3-bis(3-aminobenzoyl)benzene, 1,3-bis(4-aminobenzoyl)benzene, 1,4-bis(3-aminobenzoyl)benzene, and 1,4-bis(4-aminobenzoyl)benzene;

bisaminodimethylbenzylbenzenes such as 1,3-bis(3-amino-α,α-dimethylbenzyl)benzene, 1,3-bis(4-amino-α,α-dimethylbenzyl)benzene, 1,4-bis(3-amino-α,α-dimethylbenzyl)benzene, and 1,4-bis(4-amino-α,α-dimethylbenzyl)benzene;

bisaminoditrifluoromethylbenzylbenzenes such as 1,3-bis(3-amino-α,α-ditrifluoromethylbenzyl)benzene, 1,3-bis(4-amino-α,α-ditrifluoromethylbenzyl)benzene, 1,4-bis(3-amino-α,α-ditrifluoromethylbenzyl)benzene, and 1,4-bis(4-amino-α,α-ditrifluoromethylbenzyl)benzene;

aminophenoxybiphenyls such as 2,6-bis(3-aminophenoxy)benzonitrile, 4,4'-bis(3-aminophenoxy)biphenyl, 4,4'-bis(4-aminophenoxy)biphenyl, and bis[1-(3-aminophenoxy)]biphenyl;

aminophenoxyphenyl ketones such as bis[4-(3-aminophenoxy)phenyl]ketone, and bis[4-(4-aminophenoxy)phenyl]ketone;

aminophenoxyphenyl sulfides such as bis[4-(3-aminophenoxy)phenyl]sulfide, and bis[4-(4-aminophenoxy)phenyl]sulfide;

aminophenoxyphenyl sulfones such as bis[4-(3-aminophenoxy)phenyl]sulfone, and bis[4-(4-aminophenoxy)phenyl]sulfone;

aminophenoxyphenyl ethers such as bis[4-(3-aminophenoxy)phenyl]ether, and bis[4-(4-aminophenoxy)phenyl]ether;

aminophenoxyphenylpropanes such as 2,2-bis[4-(3-aminophenoxy)phenyl]propane, 2,2-bis[3-(3-aminophenoxy)phenyl]-1,1,1,3,3,3-hexafluoropropane, and 2,2-bis[4-(4-aminophenoxy)phenyl]-1,1,1,3,3,3-hexafluoropropane;

bis(aminophenoxybenzoyl)benzenes such as 1,3-bis[4-(3-aminophenoxy)benzoyl]benzene, 1,3-bis[4-(4-aminophenoxy)benzoyl]benzene, 1,4-bis[4-(3-aminophenoxy)benzoyl]benzene, and 1,4-bis[4-(4-aminophenoxy)benzoyl]benzene;

bis(aminophenoxy-α,α-dimethylbenzyl)benzenes such as 1,3-bis[4-(3-aminophenoxy)-α,α-dimethylbenzyl]benzene, 1,3-bis[4-(4-aminophenoxy)-α,α-dimethylbenzyl]benzene, 1,4-bis[4-(3-aminophenoxy)-α,α-dimethylbenzyl]benzene, and 1,4-bis[4-(4-aminophenoxy)-α,α-dimethylbenzyl]benzene;

bis[(aminoaryloxy)benzoyl]diphenyl ethers such as 4,4'-bis[4-(4-aminophenoxy)benzoyl]diphenyl ether;

bis(amino-α,α-dimethylbenzylphenoxy)benzophenones such as 4,4'-bis[4-(4-amino-α,α-dimethylbenzyl)phenoxy]benzophenone;

bis[amino-α,α-dimethylbenzylphenoxy]diphenylsulfones such as 4,4'-bis[4-(4-amino-α,α-dimethylbenzyl)phenoxy]diphenylsulfone;

bis[aminophenoxyphenoxy]diphenylsulfones such as 4,4'-bis[4-(4-aminophenoxy)phenoxy]diphenylsulfone;

diaminodiaryloxybenzophenones such as 3,3'-diamino-4,4'-diphenoxybenzophenone, and 3,3'-diamino-4,4'-dibiphenoxybenzophenone;

Diaminoaryloxybenzophenones such as 3,3'-diamino-4-phenoxybenzophenone, and 3,3'-diamino-4-biphenoxybenzophenone; and 1-(4-aminophenyl)-2,3-dihydro-1,3,3-trimethyl-1H-indene-5-amine.

Examples of diaminoethers include bis(aminomethyl)ether, bis(2-aminoethyl)ether, bis(3-aminopropyl)ether, bis[(2-aminomethoxy)ethyl]ether, bis[2-(2-aminoethoxy)ethyl]ether, bis[2-(3-aminopropoxy)ethyl]ether, 1,2-bis(aminomethoxy)ethane, 1,2-bis(2-aminoethoxy)ethane, 1,2-bis[2-(aminomethoxy)ethoxy]ethane, 1,2-bis[2-(2-aminoethoxy)ethoxy]ethane, ethylene glycol bis(3-aminopropyl)ether, diethylene glycol bis(3-aminopropyl)ether, and triethylene glycol bis(3-aminopropyl)ether.

Examples of diaminopolysiloxanes include α,ω-bis(2-aminoethyl)polydimethylsiloxane, α,ω-bis(3-aminopropyl)polydimethylsiloxane, α,ω-bis(4-aminobutyl)polydimethylsiloxane, α,ω-bis(5-aminopentyl)polydimethylsiloxane, α,ω-bis[3-(2-aminophenyl)propyl]polydimethylsiloxane, and α,ω-bis[3-(4-aminophenyl)propyl]polydimethylsiloxane.

These components (a2-1) may be used alone or two or more thereof may be used in combination. Among these, alicyclic diamines and aromatic diamines are preferable because the cured product exhibits excellent heat resistance.

The amount of the component (a2-1) used in 100 mol % of monomer groups constituting the component (A) is usually 90 mol % or less, and preferably 50 mol % or less.

In addition, the amount of the component (a2-1) used in 100 mol % of the component (a2) is usually 90 mol % or less, and preferably 70 mol % or less.

The component (A) of the disclosure can be obtained by various known production methods. As the production method thereof, for example, a method including a process in which monomer groups including the component (a1) and the component (a2) are subjected to a polyaddition reaction at a temperature of preferably about 30 to 120° C. and more preferably about 40 to 100° C. for a time of preferably about 0.1 to 2 hours, and more preferably about 0.1 to 0.5 hours to obtain a polyadduct, and a process in which the obtained polyadduct is subjected to an imidization reaction, that is, a dehydration ring-closing reaction, at a temperature of preferably about 80 to 250° C., and more preferably about 80 to 170° C. for a time of preferably about 0.5 to 50 hours, and more preferably about 1 to 20 hours. Here, the method, and order of mixing the component (a1) and the component (a2) are not particularly limited.

Here, in the imidization reaction process, various known reaction catalysts, dehydrating agents, and organic solvents may be used, and these may be used alone or two or more thereof may be used in combination.

Examples of reaction catalysts include aliphatic tertiary amines such as triethylamine; aromatic tertiary amines such as dimethylaniline; and heterocyclic tertiary amines such as pyridine, picoline, and isoquinoline. In addition, examples of dehydrating agents include aliphatic carboxylic acid anhydrides such as acetic anhydride and aromatic carboxylic acid anhydrides such as benzoic anhydride.

Examples of organic solvents include nitrogen-based organic solvents such as N-methyl-2-pyrrolidone, N,N-dimethylformamide, N,N-diethylformamide, N,N-dimethylacetamide, N,N-diethylacetamide, and diazabicycloundecene; ketones such as methyl ethyl ketone, diethyl ketone, cyclopentanone, cyclohexanone, and methylcyclohexanone; ethers such as ethylene glycol dimethyl ether, diisopropyl ether, tetrahydrofuran, and dioxane; alcohols such as methanol, ethanol, n-propyl alcohol, isopropyl alcohol, 1-methoxy-2-propyl alcohol, and t-butyl alcohol; aliphatic hydrocarbons such as hexane and heptane; alicyclic hydrocarbons such as cyclohexane, methylcyclohexane, and ethylcyclohexane; aromatic hydrocarbons such as benzene, toluene, and xylene; ethyl acetate and dimethyl sulfoxide. These may be used alone or two or more thereof may be used in combination. Here, when an organic solvent is used, the used amount thereof is adjusted so that the reaction concentration is 5 to 60 wt %, and preferably 20 to 50 wt %.

The imide closed ring rate of the component (A) is preferably 90 to 100% and more preferably about 95 to 100% so that the component (A) having both a high softening point and flexibility is obtained. Here, the "imide closed ring rate" indicates the content of cyclic imide bonds in the polyimide of the component (A), and can be determined by various spectroscopic methods, for example, NMR and IR analysis.

Regarding physical properties of the component (A) for example, the weight average molecular weight of the component (A) is preferably 20,000 to 100,000. The number average molecular weight of the component (A) is preferably 5,000 to 50,000. The weight average molecular weight and the number average molecular weight are obtained as polystyrene conversion values measured through, for example, gel permeation chromatography (GPC).

The softening point of the component (A) of the disclosure is preferably about 50 to 250° C. and more preferably about 80 to 200° C. Here, the softening point indicates a temperature at which the storage elastic modulus begins to decrease in the profile of the storage elastic modulus measured using a commercially available measuring instrument (product name: "ARES-2KSTD-FCO-STD," commercially available from Rheometric Scientfic) or the like.

The content proportion of the component (A) in 100 wt % of the photosensitive resin composition is preferably 50 to 99 wt % and more preferably 70 to 95 wt % in terms of the non-volatile content weight because the cured product exhibits low dielectric constant properties and excellent adhesion to a support.

The components (B) are maleimides, and various known components can be used along as they have one or more maleimide groups. When the component (B) is added, curing can be performed with active energy rays and excellent developability is easily exhibited when a resist pattern is formed.

Examples of components (B) include maleimide; N-alkylmaleimides such as N-methylmaleimide, N-ethylmaleimide, N-n-propylmaleimide, N-isopropylmaleimide, N-n-butylmaleimide, N-isobutylmaleimide, N-tert-butylmaleimide, N-n-pentylmaleimide, N-n-hexylmaleimide, N-n-heptylmaleimide, N-n-octylmaleimide, N-n-nonylmaleimide, N-n-decylmaleimide, N-n-dodecylmaleimide, N-n-tetradecylmaleimide, N-n-hexadecylmaleimide, and N-n-octadecylmaleimide;

- N-cycloalkylmaleimides such as N-cyclopentylmaleimide and N-cyclohexylmaleimide; N-arylmaleimides such as N-phenylmaleimide, N-(2-methylphenyl)maleimide, N-(4-methylphenyl)maleimide, N-(2,6-diethylphenyl)maleimide, N-phenylmethylmaleimide, N-(4-hydroxyphenyl)maleimide, N-(4-carboxyphenyl)maleimide, N-(4-acetylphenyl)maleimide, N-(4-methoxyphenyl)maleimide, N-(4-ethoxyphenyl)maleimide, N-(4-chlorophenyl)maleimide, and N-(4-bromophenyl)maleimide;
- N,N'-alkylenebismaleimides such as N,N'-ethylene bismaleimide, N,N'-trimethylene bismaleimide, N,N'-tetramethylene bismaleimide, N,N'-pentamethylene bismaleimide, N,N'-hexamethylenebismaleimide, N,N-heptamethylenebismaleimide, N,N-octamethylenebismaleimide, 1,6'-bismaleimide-(2,2,4-trimethyl)hexane, and 1,1'-(decane-1,10-diyl)bis(1H-pyrrole-2,5-dione);
- bismaleimides having cycloalkanes such as N,N'-dicyclohexylmethane bismaleimide, 1,1'-[(4-hexyl-3-octylcyclohexane-1,2-diyl)bis(octane-1,8-diyl)]bis(1H-pyrrole-2,5-dione), 1,1'-(cyclohexane-1,10-diyl)bis(1H-pyrrole-2,5-dione), and 1,1'-[4,4'-methylenebis(cyclohexane-1,4-diyl)]bis(1H-pyrrole-2,5-dione);
- phenylene bismaleimides such as N,N'-xylene bismaleimide, N,N'-tolylene bismaleimide, N,N'-xylylene bismaleimide, N,N'-m-phenylene bismaleimide, N,N'-p-phenylene bismaleimide, and 4-methyl-1,3-phenylenebismaleimide;
- bisphenylene bismaleimides such as 1,1'-[methylenebis(1,4-phenylene)]bis(1H-pyrrole-2,5-dione), 1,1'-[methylenebis(2-ethyl-6-methyl-1,4-phenylene)]bis(1H-pyrrole-2,5-dione, and 1,1'-(1,3-phenylene)bis(1H-pyrrole-2,5-dione);
- N,N'-diphenylbismaleimides such as 3,3'-dimethyl-5,5'-diethyl-4,4-diphenylmethane bismaleimide, N,N'-(4,4'-diphenylmethane)bismaleimide, N,N'-4,4'-[3,3'-dimethyldiphenylmethane]bismaleimide, N,N'-4,4'-[3,3'-diethyldiphenylmethane]bismaleimide, N,N'-(4,4'-diphenylpropane)bismaleimide, N,N'-diphenylcyclohexanebismaleimide, 3,3'-dimethyl-5,5'-diethyl-4,4'-diphenylmethanebismaleimide, N,N'-diphenyletherbismaleimide, 1,3-bis(3-maleimidophenoxy)benzene, 1,3-bis(3-maleimidophenoxy)benzene, 1,3-bis(4-maleimidophenoxy)benzene, N,N'-3,3'-diphenylsulfone bismaleimide, N,N'-4,4'-diphenylsulfone bismaleimide, N,N'-dichlorodiphenylbismaleimide, and 1,1'-[2,2'-bis(trifluoromethyl) {1,1'-biphenyl}-4,4'-diyl]bis[1H-pyrrole-2,5-dione]; and
- bis(phenoxyphenyl)alkanes such as 2,2-bis[4-(4-maleimidophenoxy)phenyl]propane, 2,2-bis[4-(4-maleimidophenoxy)phenyl]hexafluoropropane, 2,2-bis[3-methyl-4-(4-maleimidophenoxy)phenyl]propane, 2,2-bis[3-methyl-4-(4-maleimidophenoxy)phenyl] hexafluoropropane, 2,2-bis[3,5-dimethyl-4-(4-maleimidophenoxy)phenyl]propane, 2,2-bis[3,5-dimethyl-4-(4-maleimidophenoxy)phenyl] hexafluoropropane, 2,2-bis[3-ethyl-4-(4-maleimidophenoxy)phenyl]propane, and 2,2-bis[3-ethyl-4-(4-maleimidophenoxy)phenyl] hexafluoropropane. These may be used alone or two or more thereof may be used in combination.

In addition, examples of commercial products of the component (B) include "BMI," "BMI-70," and "BMI-80" (all commercially available from KI Chemical Industry Co., Ltd.), "BMI-1000," "BMI-1000H," "BMI-1100," "BMI-1100H," "BMI-2000," "BMI-2300," "BMI-3000," "BMI-3000H," "BMI-4000," "BMI-5100," "BMI-7000," "BMI-7000H," and "BMI-TMH" (all commercially available from Daiwa Fine Chemicals Co., Ltd.).

In addition, as the component (B), maleimides derived from the dimer diamine described above (hereinafter referred to as maleimides having a dimer diamine framework) may be used. Examples of commercial products of the maleimides include "BMI-689," "BMI-689C," "BMI-1400," "BMI-1500," "BMI-1550," "BMI-1700," "BMI-2500," "BMI-2560," "BMI-3000-C," "BMI-3000J," "BMI-3000 Solution," "BMI-5000P," "BMI-5000T," "BMI-6000," and "BMI-6100" (all commercially available from Designer Molecule Inc.).

Among these components (B), N,N'-diphenylbismaleimides and maleimides having a dimer diamine framework are preferable because they are easily compatible with the component (A), and the obtained cured product exhibits low dielectric constant properties.

The content proportion of the component (B) in 100 wt % of the photosensitive resin composition is preferably 1 to 20 wt % and more preferably 2 to 20 wt % in terms of the non-volatile content weight because the component reacts with active energy rays and the obtained cured product exhibits excellent adhesion to a support.

The component (C) is a polyfunctional polymerizable compound having an ethylenic double bond other than the component (A) and the component (B), and when the component (C) is added, the cured product exhibits low dielectric constant properties and excellent developability is also easily improved when a resist pattern is formed.

The compound here means a generic term for monomers, oligomers, and polymers.

Examples of components (C) include
dienes such as 1,3-butadiene, 2-methyl-1,3-butadiene, 2,3-dimethyl-1,3-butadiene, 1,3-pentadiene, 1,4-pentadiene, 2,3-pentadiene, 2,4-dimethyl-1,3-pentadiene, 1,5-hexadiene, 2,4-hexadiene, 2,5-dimethyl-2,4-hexadiene, 1,6-heptadiene, 1,7-octadiene, nonadiene, and decadiene; aromatic dialkenyls such as divinylbenzene, 1,3-diisopropenylbenzene, and 1,4-diisopropenylbenzene;

divinyl ethers such as ethylene glycol divinyl ether, diethylene glycol divinyl ether, triethylene glycol divinyl ether, polyethylene glycol divinyl ether, propylene glycol divinyl ether, dipropylene glycol divinyl ether, polypropylene glycol divinyl ether, butanediol divinyl ether, and cyclohexane dimethanol divinyl ether;
diallyl ethers such as ethylene glycol diallyl ether, diethylene glycol diallyl ether, triethylene glycol diallyl ether, polyethylene glycol diallyl ether, glycerin diallyl ether, trimethylolpropane diallyl ether, pentaerythritol diallyl ether, and cyclohexane dimethanol diallyl ether;
triallyl ethers such as glycerin triallyl ether, trimethylolpropane triallyl ether, and pentaerythritol triallyl ether;
tetraallyl ethers such as pentaerythritol tetraallyl ether;
diallyl carboxylates such as diallyl phthalate, diallyl maleate, diallyl itaconate, diallyl terephthalate, and diallyl adipate;
polyallylamines such as diallylamine, diallylmethylamine, and triallylamine;
allyl isocyanurates such as 1,3-diallyl-5-methyl isocyanurate, 1,3-diallyl-5-glycidyl isocyanurate, and 1-allyl-3,5-diglycidyl isocyanurate;
di(meth)acrylates such as ethylene glycol di(meth)acrylate, diethylene glycol di(meth)acrylate, triethylene glycol di(meth)acrylate, tetraethylene glycol di(meth)acrylate, polyethylene glycol di(meth)acrylate, dipropylene glycol di(meth)acrylate, tripropylene glycol di(meth)acrylate, polypropylene glycol di(meth)acrylate, glycerin di(meth)acrylate, glycerin tri(meth)acrylate, 1,3-butylene glycol di(meth)acrylate, 1,4-butanediol di(meth)acrylate, 1,5-pentanediol di(meth)acrylate, neopentyl glycol di(meth)acrylate, 1,6-hexanediol di(meth)acrylate, ethoxylated-1,6-hexanediol di(meth)acrylate, 1,8-octanediol di(meth)acrylate, 1,9-nonanediol di(meth)acrylate, and polyphenylene ether di(meth)acrylate; tri(meth)acrylates such as trimethylolpropane tri(meth)acrylate, ethoxylated trimethylolpropane tri(meth)acrylate, caprolactone-modified trimethylolpropane tri(meth)acrylate, tetramethylolmethane tri(meth)acrylate, and tetramethylolpropane tri(meth)acrylate; tetra(meth)acrylates such as ditrimethylolpropane tetra(meth)acrylate, and tetramethylolmethane tetra(meth)acrylate;
cycloalkane di(meth)acrylates such as cyclohexane dimethanol di(meth)acrylate, and tricyclodecanedimethanol di(meth)acrylate;
pentaerythritol poly(meth)acrylates such as pentaerythritol di(meth)acrylate, pentaerythritol tri(meth)acrylate, pentaerythritol tetra(meth)acrylate, and ethoxylated pentaerythritol tetra(meth)acrylate;
dipentaerythritol poly(meth)acrylates such as dipentaerythritol di(meth)acrylate, dipentaerythritol tri(meth)acrylate, dipentaerythritol tetra(meth)acrylate, dipentaerythritol penta(meth)acrylate, dipentaerythritol hexa(meth)acrylate, and caprolactone-modified dipentaerythritol hexa(meth)acrylate;
tripentaerythritol poly(meth)acrylate;
isoprene polymers such as polyisoprene, 1,2-polybutadiene homopolymers, isobutylene-isoprene polymers, styrene-isoprene polymers, and styrene-isoprene polymer-styrene; and butadiene polymers such as polybutadiene, 1,2-butadiene homopolymers, butadiene-isoprene polymers, butadiene-acrylonitrile polymers, ethoxylated polybutadiene, epoxidized polybutadiene, butadiene-styrene polymers, and styrene-butadiene-styrene polymers.

These components (C) may be used alone or two or more thereof may be used in combination. Among these, diene polymers are preferable, and 1,2-butadiene homopolymers, butadiene-styrene polymers, and epoxidized polybutadiene are more preferable because the cured product exhibits low dielectric constant properties and exhibits excellent adhesion to a support.

In addition, regarding physical properties of the component (C), in consideration of solubility in solvents and adhesion to a support, the weight average molecular weight is preferably 100 to 10,000 and more preferably 1,000 to 9,000. Here, the "weight average molecular weight" is a value described in the catalogs of various chemical manufacturers.

The content proportion of the component (C) in 100 wt % of the photosensitive resin composition is preferably 0.5 to 20 wt % and more preferably 1 to 15 wt % in terms of the non-volatile content weight in consideration of a low dielectric constant and adhesion to a support.

In addition, the ratio between the maleimide equivalent of the component (B) and the ethylenic double bond equivalent of the component (C), which is {maleimide equivalent of the component (B)}/{ethylenic double bond equivalent of the component (C)}, is preferably 0.05 to 2 and more preferably 0.2 to 1.5 in consideration of the photoreactivity and developability, The maleimide equivalent of the component (B) is determined from the amount of the component (B) prepared, the number average molecular weight (Mn) and the number of maleimide groups (Formula A).

$$\{\text{the maleimide equivalent of the component } (B)\} = \{\text{the amount of the component } (B) \text{ prepared}\}/[\{\text{the molecular weight (Mn) of the component } (B)\} \times (\text{the number of maleimide groups})] \quad \text{(Formula A)}$$

The equivalent of ethylenic double bond groups of the component (C) is determined from the amount of the component (C) prepared, the number average molecular weight (Mn) and the number of ethylenic double bonds (Formula B).

$$\{\text{the equivalent of ethylenic double bond groups of the component } (C)\} = \{\text{the amount of the component } (C) \text{ prepared}\}/[\{\text{the molecular weight (Mn) of the component } (C)\} \times (\text{the number of ethylenic double bonds})] \quad \text{(Formula B)}$$

The photosensitive resin composition of the disclosure may further contain an amine compound (D) (hereinafter referred to as a component (D)) other than the component (a2).

Examples of components (D) include reactive alkoxysilyl compounds having an amino group and heterocyclic amino compounds. These may be used alone or two or more thereof may be used in combination.

Regarding reactive alkoxysilyl compounds having an amino group, those represented by a general formula: W—Si$(R^1)_a(OR^2)_{3-a}$ (in the formula, W represents a group containing an amino group, $R^1$ represents a hydrogen atom or a hydrocarbon group having 1 to 8 carbon atoms, $R^2$ represents a hydrocarbon group having 1 to 8 carbon atoms, and a represents 0, 1 or 2) may be exemplified, and for example, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-ureidopropyltrialkoxysilane, and 3-ethoxysilyl-N-(1,3-dimethylbutylidene)propylamine may be exemplified. These may be used alone or two or more thereof may be used in combination.

Examples of heterocyclic amino compounds include pyridines such as pyridine, 4,4-dimethylaminopyridine, and 4-piperidinopyridine;

imidazoles such as 2-methylimidazole, 1,2-dimethylimidazole, 2-ethylimidazole, 2-ethyl methylimidazole, 2-undecylimidazole, 2-heptadecylimidazole, 2-phenylimidazole, benzimidazole, 2-phenyl-4-methylimidazole, 1-benzyl-2-phenylimidazole, and 1-benzyl-2-methylimidazole; diazabicyclo compounds such as diazabicyclooctane, diazabicyclononene, and diazabicycloundecene;

triazabicyclo compounds such as triazabicyclodecene and methyltriazabicyclodecene; and salts of these heterocyclic amino compounds. Examples of the above salts include inorganic acid salts such as hydrochloride, sulfate, and phosphate; and organic acid salts such as acetate, hexanoate, 2-ethylhexanoate, octanoate, trimellitate, and isocyanurate. These may be used alone or two or more thereof may be used in combination.

The content proportion of the component (D) in 100 wt % of the photosensitive resin composition is preferably 0.001 to 1 wt % and more preferably 0.01 to 0.3 wt % in terms of the non-volatile content weight because the cured product exhibits low dielectric constant properties and excellent developability is provided when a resist pattern is formed.

The photosensitive resin composition of the disclosure may further contain a reactive alkoxysilyl compound (E) having a vinyl group (hereinafter referred to as a component (E)).

Examples of components (E) include trimethoxyvinylsilane, triethoxyvinylsilane, methyldiethoxyvinylsilane, methyldimethoxyvinylsilane and phenyldimethoxyvinylsilane. These may be used alone or two or more thereof may be used in combination.

The content proportion of the component (E) in 100 wt % of the photosensitive resin composition is preferably 0.05 to 2 wt % and more preferably 0.1 to 1 wt % in terms of the non-volatile content weight because the cured product exhibits excellent adhesion to a support and easily exhibits excellent developability when a resist pattern is formed.

The photosensitive resin composition of the disclosure may further contain the above organic solvent. The content thereof with respect to 100 parts by weight of the photosensitive resin composition is preferably about 10 to 2,000 parts by weight.

The photosensitive resin composition of the disclosure may further contain a photopolymerization initiator.

Examples of photopolymerization initiators include alkylphenone photopolymerization initiators, acylphosphine oxide photopolymerization initiators, thioxanthone photopolymerization initiators, titanocene photopolymerization initiators, and oxime ester photopolymerization initiators. These may be used alone or two or more thereof may be used in combination.

Examples of alkylphenone photopolymerization initiators include benzyl dimethyl ketal photopolymerization initiators such as 2-methyl-1-(4-methylthiophenyl)-2-morpholino-1-propanone, 2-benzyl-2-dimethylamino-1-(4-morpholinophenyl)butanone-1, and 2,2-dimethoxy-1,2-diphenylethan-1-one;

α-hydroxyalkylphenone photopolymerization initiators such as 1-hydroxycyclohexylphenyl ketone, 2-hydroxy-2-methyl-1-phenylpropan-1-one, 1-[4-(2-hydroxyethoxy)-phenyl]-2-hydroxy-2-methyl-1-propane-1-one, and 2-hydroxy-1-{4-[4-(2-hydroxy-2-methylpropionyl)benzyl]phenyl}-2-methylpropan-1-one; and α-aminoacetophenone photopolymerization initiators such as 2-methyl-1-[4-(methylthio)phenyl]-2-morpholinopropanone-1,2-benzyl-2-dimethylamino-1-(4-morpholinophenyl)-butan-1-one, 2-(dimethylamino)-2-[(4-methylphenyl)methyl]-1-[4-(4-morpholinyl)phenyl]-1-butanone, and N,N-dimethylaminoacetophenone. These may be used alone or two or more thereof may be used in combination.

Examples of acylphosphine oxide photopolymerization initiators include (2,6-dimethoxybenzoyl)-2,4,4-pentylphosphine oxide, 2,4,6-trimethylbenzoyldiphenylphosphine oxide, ethyl-2,4,6-trimethylbenzoylphenylphosphine oxide, bis(2,4,6-trimethylbenzoyl)phenylphosphine oxide, (2,5-dihydroxyphenyl)diphenylphosphine oxide, (p-hydroxyphenyl)diphenylphosphine oxide, bis(p-hydroxyphenyl)phenylphosphine oxide, tris(p-hydroxyphenyl)phosphine oxide, and bis(2,6-dimethoxybenzoyl)-2,4,4-trimethylpentylphosphine oxide. These may be used alone or two or more thereof may be used in combination.

Examples of thioxanthone photopolymerization initiators include thioxanthone, 2,4-diethylthioxanthen-9-one, 2-isopropylthioxanthone, and 2-chlorothioxanthone. These may be used alone or two or more thereof may be used in combination.

Examples of titanocene photopolymerization initiators include bis(η-5-2,4-cyclopentadien-1-yl)-bis(2,6-difluoro-3-(1H-pyrrol-1-yl)phenyl)titanium. These may be used alone or two or more thereof may be used in combination.

Examples of oxime ester photopolymerization initiators include benzoins such as benzoin, benzoin methyl ether, and benzoin isopropyl ether;

aromatic ketone such as acetophenone, 2,2-dimethoxy-2-phenylacetophenone, 2,2-diethoxy-2-phenylacetophenone, 1,1-dichloroacetophenone, 1-hydroxycyclohexylphenyl ketone, 2-benzyl-2-dimethylamino-1(4-morpholinophenyl)-butanone-1,2-methyl-1-[4-(methylthio)phenyl]-2-morpholino-propanone-1-one, and N,N-dimethylaminoacetophenone;

anthraquinones such as 2-methylanthraquinone, 2-ethylanthraquinone, 2-tert-butylanthraquinone, 1-chloroanthraquinone, 2-amylanthraquinone, and 2-aminoanthraquinone;

ketals such as acetophenone dimethyl ketal, and benzyl dimethyl ketal;

benzophenones such as benzophenone, methylbenzophenone, 4,4'-dichlorobenzophenone, and 4-benzoyl-4'-methyldiphenylsulfide;

acridine derivatives such as 9-phenylacridine and 1,7-bis(9,9'-acridinyl)heptane; 2,4,5-triarylimidazole dimer or its derivatives; and 2,4,6-trimethylbenzoyldiphenylphosphine oxide. These may be used alone or two or more thereof may be used in combination.

Among these photopolymerization initiators, thioxanthone photopolymerization initiators are preferably because they easily react with the component (B) when active energy rays are emitted.

The content proportion of the photopolymerization initiator in 100 wt % of the photosensitive resin composition is preferably 0.1 to 4 wt % and more preferably 0.5 to 2 wt % in terms of the non-volatile content weight because it easily react with active energy rays and the obtained cured product exhibits low dielectric constant properties.

The photosensitive resin composition of the disclosure may further contain an additive other than the component (A), the component (B), the component (C), the component (D), the component (E), the organic solvent and the photopolymerization initiator.

Examples of additives include a ring-opening esterification reaction catalyst, a cross-linking agent, a flame retardant, a dehydrating agent, a plasticizer, a weathering agent, an antioxidant, a thermal stabilizer, a lubricant, an antistatic agent, a brightening agent, a coloring agent, a conducting agent, a mold release agent, a surface treatment agent, a viscosity adjusting agent, an inorganic filler, and an organic filler.

The content of the additive with respect to 100 parts by weight of the non-volatile content of the photosensitive resin composition is, for example, less than 1 part by weight, less than 0.1 parts by weight, less than 0.01 parts by weight, or 0 parts by weight.

The content of the additive with respect to 100 parts by weight of the component (A) is less than 1 part by weight, less than 0.1 parts by weight, less than 0.01 parts by weight, 0 parts by weight or the like in terms of the non-volatile content.

The photosensitive resin composition of the disclosure is obtained by mixing the component (A), the component (B) and the component (C), as well as, according to necessity, the component (D), the component (E), an organic solvent, a photopolymerization initiator, and an additive.

In addition, for the photosensitive resin composition of the disclosure, a composition obtained by obtaining a reaction product of the component (A) and the component (C) and then mixing the component (B), as well as, according to necessity, the component (D), the component (E), an organic solvent, a photopolymerization initiator, and an additive, can be used.

The molar amount of the component (C) when the component (A) and the component (C) are reacted is preferably 0.1 to 10 mol and more preferably 0.33 to 2 mol with respect to 1 mol of the component (A). In addition, the reaction temperature is preferably 50 to 150° C. and more preferably 80 to 120° C. The reaction time is preferably 1 minute to 100 hours and more preferably 5 minutes to 10 hours.

[Cured Product]

One embodiment of the disclosure is a cured product of the photosensitive resin composition.

The cured product of the disclosure is obtained by applying the photosensitive resin composition of the disclosure to at least one surface of a support and performing curing with heat or emission of active energy rays. Here, the obtained cured product may be used after being peeled off from the support or may be used when a layer of the cured product is provided on the support (that is, as a laminate).

Examples of supports include silicon wafers, ceramic substrates, rigid substrates, flexible substrates, release paper, release films, glass, support films, and metal foils. In addition, as a silicon wafer, one in which an inorganic protective film such as a SiN film (silicon nitride) or a $SiO_2$ film (silicon dioxide, silica) is formed on the wafer or one in which a metal layer of copper or the like is formed by a sputtering treatment or a plating treatment can be used.

Examples of support films include aromatic polyester resins obtained from polyimide, polyester, polyimide-silica hybrid, polyethylene, polypropylene, polyethylene terephthalate, polyethylene naphthalate, polymethyl methacrylate resins, polystyrene resins, polycarbonate resins, acrylonitrile-butadiene-styrene resins, ethylene terephthalate, phenol, phthalic acid, hydroxynaphthoic acid, or the like and parahydroxybenzoic acid (so-called liquid crystal polymer; "Vecstar" or the like, commercially available from Kuraray Co., Ltd.), cycloolefin polymers, and fluorine resins (polytetrafluoroethylene (PTFE), perfluoroalkoxyalkane (PFA), polyvinylidene fluoride (PVDF), etc.).

Examples of metal foils copper, stainless steel, nickel, aluminum, and aluminum alloys. In addition, particularly, examples of copper foils include rolled copper foils and electrolytic copper foils. In addition, regarding the metal foil, a metal foil subjected to a surface treatment such as roughening and rust prevention can be used. Examples of rust prevention treatments include a so-called mirror surface treatment such as a plating treatment using a plating solution containing Ni, Zn, Sn or the like and a chromate treatment. In addition, when a metal foil is used, the metal foil may be removed from the obtained photosensitive element according to an etching treatment or the like.

When the photosensitive resin composition of the disclosure is applied to the support, application methods include, for example, methods using a spin, comma, die, knife, or lip coater. The thickness of the coating layer is preferably about 3 to 20 μm and more preferably about 5 to 20 μm in terms of the layer of the cured product. In addition, the layer of the cured product may be protected with various protective films.

After the coating layer is provided, the cured product is formed using a heat source or active energy rays.

Examples of heat sources include a circulating air dryer, an electric furnace, a gas furnace, a heat medium, and a heater. In addition, in drying conditions, the temperature is preferably about 150 to 250° C., and more preferably about 180 to 220° C. In addition, the time is preferably about 0.1 to 10 hours and more preferably about 0.5 to 2 hours.

Examples of active energy rays include light rays such as ultraviolet rays, infrared rays, and visible rays, electron beams, X rays, α rays, β rays, γ rays, and neutron beams. In the disclosure, light rays are preferable, and ultraviolet rays and visible rays are more preferable.

Examples of light sources for ultraviolet rays include xenon lamps, high-pressure mercury lamps, ultra high-pressure mercury lamps, carbon arc lamps, metal halide lamps, chemical lamps, electrodeless lamps, and LED lamps. In addition, regarding the cumulative emission amount of ultraviolet rays, the cumulative emission amount is usually 300 to 10,000 $mJ/cm^2$.

Here, before active energy rays are emitted, the coating layer may be dried by heating for partial curing. Here, when drying is performed by heating, it is preferable to perform drying at a temperature of about 80 to 200° C. for 1 to 30 minutes. In addition, in order to perform curing completely even after active energy rays are emitted, as necessary, heating may be performed.

[Resist Pattern]

The resist pattern of the disclosure has a pattern, and the pattern contains the cured product. Hereinafter, a method of producing a resist pattern will be described.

[Method of Producing Resist Pattern]

The method of producing a resist pattern of the disclosure includes a process of providing a layer of the cured product on a support, a process of emitting active energy rays to at least a part of the layer of the cured product to photo-cure an exposed part, and a process of removing a part other than the exposed part to form a resist pattern.

As the method of providing a layer of the cured product, for example, a method in which the photosensitive resin composition of the disclosure whose viscosity is adjusted by adding an organic solvent in advance is applied to a support and then dried at a temperature of 80 to 150° C., and preferably 100 to 130° C. may be exemplified.

Examples of supports include silicon wafers, ceramic substrates, rigid substrates, flexible substrates, and metal foils. In addition, as the silicon wafers, one in which an inorganic protective film such as a SiN film (silicon nitride) or a $SiO_2$ film (silicon dioxide, silica) is formed on the wafer or one in which a metal layer of copper or the like is formed by a sputtering treatment or a plating treatment can be used.

Examples of application methods include methods using a spin, slit, or roll coater and screen printing.

In drying conditions, drying is preferably performed at a temperature of usually 50 to 180° C. and preferably 80 to 150° C. for 1 to 30 minutes. The thickness of the layer of the cured product after drying is preferably 3 to 50 µm, more preferably 3 to 30 µm, and still more preferably 5 to 20 µm.

Next, examples of photo-curing methods include a method in which the layer side of the cured product is covered with a mask having a predetermined pattern shape and exposure is then performed, and a part of the photosensitive resin composition is polymerized.

Examples of exposure methods include contact exposure and reduction projection exposure. In addition, the exposure wavelength is preferably 200 to 500 nm, more preferably 310 to 436 nm, and still more preferably 365 nm. In addition, the exposure amount is preferably 10,000 $mJ/cm^2$ or less and more preferably 300 to 2,000 $mJ/cm^2$.

After the exposure, the support on which the layer of the cured product is provided may be further dried. In the conditions, drying is performed at a temperature of preferably 100 to 200° C. for 1 to 30 minutes, and more preferably 3 to 20 minutes.

Then, a part other than the exposed part is removed to form a resist pattern. The part is removed using a developing solution. Examples of developing solutions include aromatic hydrocarbons such as toluene and xylene; ketones such as cyclopentanone and cyclohexanone; and ethers such as tetrahydrofuran. These may be used alone or two or more thereof may be used in combination. In addition, the developing solution may further contain an alcohol such as methanol, ethanol, or isopropyl alcohol in order to adjust the solubility during development.

Examples of developing methods include a spray method, a paddle method, and a dip method.

Next, the pattern obtained by development is cured by heating to obtain a cured product having a predetermined pattern. The heating temperature is preferably 60 to 230° C., and more preferably 150 to 230° C. In addition, the time is preferably 30 to 120 minutes.

In addition, the method of producing a resist pattern of the disclosure includes a process of providing a layer of the cured product on a support and a process of mounting a photoresist on the layer of the cured product to form a pattern and then performing cutting to remove the layer of the cured product to form a resist pattern.

As the method of providing a layer of the cured product, the above methods may be exemplified.

Next, a method of mounting a photoresist to form a pattern will be described. Any of negative and positive photoresists can be used. In addition, as a method of forming a pattern in a photoresist, photo-curing by the above exposure may be exemplified. In addition, after the exposure, an unexposed part in the case of the negative photoresist and an exposed part in the case of the positive photoresist are removed, and the patterned photoresist can be provided.

A developing solution is used to remove these parts of the photoresist. Examples of developing solutions include aromatic hydrocarbons such as toluene and xylene; ketones such as cyclopentanone and cyclohexanone; ethers such as tetrahydrofuran; and organic bases such as tetramethylammonium hydroxide. These may be used alone or two or more thereof may be used in combination. In addition, the developing solution may further contain an alcohol such as methanol, ethanol, or isopropyl alcohol in order to adjust the solubility during development.

In addition, after the pattern is formed, as necessary, drying may be performed. In the conditions, the temperature is preferably 80 to 200° C. and more preferably 80 to 120° C. In addition, the time is preferably 1 to 60 minutes and more preferably 5 to 30 minutes.

Next, as a method of cutting the layer of the cured product, for example, wet etching, dry etching, and laser processing may be used. When cutting is performed by the above method, the exposed part of the layer of the cured product can be removed to obtain a resist pattern.

The obtained resist pattern can be additionally heated and cured to obtain a cured product having a predetermined pattern. For the heating temperature and the heating time, the same heating conditions after the development described above may be exemplified.

A circuit may be formed in the resist pattern obtained by these methods with a metal such as copper according to additional plating or the like. In addition, the obtained resist pattern may be subjected to the same production method as described above to form a resist pattern thereon.

[Semiconductor Device]

A semiconductor device of the disclosure includes the resist pattern, and the pattern can be used as an interlayer insulation layer or a surface protective layer. In addition, the semiconductor device may be, for example, a semiconductor device using a semiconductor package technique such as a fan-out wafer level package and a fan-out panel level package having a multilayer wiring structure, a rewiring structure or the like.

[Electronic Device]

An electronic device of the disclosure includes the semiconductor device. Examples of electronic devices include mobile terminals, servers, and network switches.

EXAMPLES

Hereinafter, the disclosure will be described in detail with reference to examples, but the disclosure is not particularly limited. In addition, unless otherwise specified, "%" is always based on weight.

Production Example 1

70.0 g of 2,2-bis(3,4-dicarboxyphenyl)hexafluoropropane dianhydride (6FDA, commercially available from Daikin Industries, Ltd.) (hereinafter referred to as 6FDA), 132.5 g of methyl isobutyl ketone and 132.5 g of methylcyclohexane were put into a reaction container including a stirrer, a water distribution instrument, a thermometer and a nitrogen gas introduction pipe and heated to 70° C. Then, 81.0 g of a dimer diamine (product name: "PRIAMINE1075," commercially available from Croda Japan) (hereinafter referred to as PRIAMINE1075) was gradually added thereto and the mixture was then heated to 110° C. and subjected to an imidization reaction over 15 hours to obtain a solution of a polyimide resin (A-1) (a non-volatile content of 35%).

Production Example 2

200.0 g of 4,4'-[propane-2,2-diylbis(1,4-phenyleneoxy)] diphthalic dianhydride (product name "BisDA-1000," commercially available from SABIC Innovative Plastics Japan LLC) (hereinafter referred to as BisDA), 265.27 g of ethylene glycol dimethyl ether and 618.97 g of toluene were put into the same reaction container as in Production Example 1 and heated to 70° C. Then, 197.8 g of PRIAMINE1075 was gradually added thereto and the mixture was then heated to 110° C. and subjected to an imidization reaction over 10 hours to obtain a solution of a polyimide resin (A-2) (a non-volatile content of 30%).

Production Example 3

200.0 g of BisDA, 619.0 g of butyl acetate, 132.6 g of ethylene glycol dimethyl ether and 132.6 g of methylcyclohexane were put into the same reaction container as in Production Example 1 and heated to 75° C. Then, 197.8 g of PRIAMINE1075 was gradually added thereto and the mixture was then heated to 115° C. and subjected to an imidization reaction over 10 hours to obtain a solution of a polyimide resin (A-3) (a non-volatile content of 30%).

Example 1

10 g of the solution of the polyimide resin (A-1) (non-volatile content: 3.5 g) as the component (A), 0.23 g of 4,4-diphenylmethane bismaleimide (product name: "BMI-1000H," commercially available from Daiwa Fine Chemicals Co., Ltd.) (non-volatile content: 0.23 g) as the component (B), 0.16 g of a butadiene-styrene polymer (product name: "Ricon100," commercially available from Cray Valley) (non-volatile content: 0.16 g) as the component (C), and 5.17 g of cyclopentanone were mixed and thoroughly stirred to obtain a curable photosensitive resin composition having a non-volatile content of 25%.

Examples 2 to 20 and Comparative Examples 1 to 3

Curable photosensitive resin compositions were obtained in the same manner as in Example 1 according to the compositions shown in Table 1.

Hereinafter, the layer of the cured product of the curable photosensitive resin composition will be simply referred to as a cured product layer.

(Preparation of Cured Product)

The curable photosensitive resin compositions of Examples 1 to 20 and Comparative Examples 1 to 3 were applied to release paper (commercially available from Sun A Kaken Co., Ltd.) and dried at 120° C. for 5 minutes and then exposed with ultraviolet rays from a high-pressure mercury lamp (200 mW/cm$^2$, 1,800 mJ/cm$^2$). In addition, drying was performed at 170° C. for 30 minutes and the release paper was then peeled off to obtain a cured product. In addition, a plurality of cured products were superimposed so that the total thickness was 40 to 150 μm and placed on a press support, and additionally, the same press support was placed on the top part of the cured product layer, the sample was cured by heating and pressing at a pressure of 5 MPa and 200° C. for 1 hour through the press support and the press support was then removed to obtain test pieces. Using the test pieces, a dielectric constant (Dk) and a dielectric dissipation factor (Df) were measured by the following method. Here, since the photosensitive resin composition of Comparative Example 1 could not form a film, it was not evaluated.

(Dielectric Constant and Dielectric Dissipation Factor)

Using a network analyzer (device name: "P5003A," commercially available from Keysight Technologies) and a split post dielectric resonator with a measurement frequency of 10.124 GHz (commercially available from QWED), the resonance frequency and the peak Q value of a single resonator in which nothing was inserted were measured.

Next, after the test piece was cut into 4 cm×5 cm and inserted into the resonator, the resonance frequency and the Q value when the test piece was inserted were measured.

The dielectric constant (Dk) was calculated from the difference between the resonance frequency of a single resonator and the resonance frequency when the test piece was inserted, and the dielectric dissipation factor (DO was calculated from the difference in the Q value and the difference in the resonance frequency when a single resonator was used and when the test piece was inserted. Table 1 shows the results (the same hereinafter).

The curable photosensitive resin compositions of Examples 1 to 20 and Comparative Examples 1 to 3 were applied to a commercially available electrolytic copper foil (product name: "F2-WS," commercially available from Furukawa Electric Co., Ltd.) (a thickness of 18 μm) so that the thickness of the cured product layer was 10 μm and dried at 120° C. for 5 minutes. Then, the sample was cured by emitting ultraviolet rays from a high-pressure mercury lamp (200 mW/cm$^2$, 1,800 mJ/cm$^2$) and then additionally dried at 200° C. for 1 hour to obtain a laminate (1).

(Adhesion)

Using the laminate (1), the adhesion between the copper foil and the cured product layer was evaluated by a cross-cut method according to JIS-K 5600-5-6: 1999. In addition, the laminate (1) was prepared in the same manner by replacing the electrolytic copper foil with commercially available glass (commercially available from Nippon Test Panel Co., Ltd.), and the adhesion was evaluated in the same manner.

(Developability)

The curable photosensitive resin compositions of Examples 1 to 20 and Comparative Examples 1 to 3 were applied to a commercially available electrolytic copper foil (product name "F2-WS," commercially available from Furukawa Electric Co., Ltd.) (a thickness of 18 μm) so that the thickness of the cured product layer after development was 10 μm and dried at 120° C. for 5 minutes to obtain a laminate. Then, a part of the cured product layer was covered with a light-blocking aluminum foil (commercial product, 2 cm×5 cm) and exposed to ultraviolet rays from a high-pressure mercury lamp (200 mW/cm$^2$, 1,800 mJ/cm$^2$) and then immersed in cyclopentanone having a non-volatile content concentration of 100% for 1 minute, and the light-blocked unexposed part was removed (the part remaining after removal is called an exposed part). The unexposed part and the exposed part were evaluated based on the following evaluation criteria.

(Evaluation Criteria)

※ Unexposed part

○: dissolved without residue after immersion x: residue remained after immersion ※ Exposed part ○: insoluble, no appearance abnormality was observed x: dissolved, or appearance abnormality such as film lifting was observed

TABLE 1

| | Polyimide resin (wt %) | | Maleimides (wt %) | | Polyfunctional polymerizable compound (wt %) | | | | Amine compound (wt %) | | Photopolymerization initiator (wt %) | |
|---|---|---|---|---|---|---|---|---|---|---|---|---|
| Example 1 | A-1 | 90 | B-1 | 5.8 | C-1 | 4.2 | — | | — | | — | |
| Example 2 | A-2 | 90 | B-1 | 5.8 | C-1 | 4.2 | — | | — | | — | |
| Example 3 | A-3 | 90 | B-1 | 5.8 | C-1 | 4.2 | — | | — | | — | |
| Example 4 | A-1 | 90 | B-2 | 7.3 | C-1 | 2.7 | — | | — | | — | |
| Example 5 | A-1 | 90 | B-3 | 8.7 | C-1 | 1.3 | — | | — | | — | |
| Example 6 | A-1 | 90 | B-1 | 3.6 | C-2 | 6.4 | — | | — | | — | |
| Example 7 | A-1 | 92.5 | B-2 | 6.1 | C-3 | 1.4 | — | | — | | — | |
| Example 8 | A-1 | 90 | B-2 | 9.3 | C-4 | 0.7 | — | | — | | — | |
| Example 9 | A-1 | 95 | B-1 | 2.9 | C-1 | 2.1 | — | | — | | — | |
| Example 10 | A-1 | 90 | B-1 | 4.1 | C-1 | 5.9 | — | | — | | — | |
| Example 11 | A-1 | 90 | B-3 | 7.7 | C-1 | 2.3 | — | | — | | — | |
| Example 12 | A-1 | 89.8 | B-1 | 8.7 | C-1 | 1.3 | — | | D-1 | 0.200 | — | |
| Example 13 | A-1 | 89.8 | B-1 | 5.8 | C-1 | 4.2 | — | | D-1 | 0.200 | — | |
| Example 14 | A-1 | 92.485 | B-2 | 6.1 | C-1 | 1.4 | — | | D-2 | 0.015 | — | |
| Example 15 | A-1 | 90 | B-1 | 4.4 | C-1 | 4.2 | C-3 | 1.4 | — | | — | |
| Example 16 | A-1 | 89.986 | B-1 | 4.4 | C-1 | 4.2 | C-3 | 1.4 | D-2 | 0.014 | — | |
| Example 17 | A-1 | 89.986 | B-1 | 4.4 | C-1 | 4.2 | C-3 | 1.4 | D-3 | 0.014 | — | |
| Example 18 | A-1 | 69.989 | B-2 | 16.5 | C-1 | 12.4 | C-3 | 1.1 | D-3 | 0.011 | — | |
| Example 19 | A-1 | 87.9 | B-2 | 6 | C-2 | 3.8 | C-3 | 1.3 | — | | DETX | 1 |
| Example 20 | A-1 | 68.989 | B-2 | 16.5 | C-1 | 12.4 | C-3 | 1.1 | D-3 | 0.011 | DETX | 1 |
| Comparative Example 1 | — | | B-2 | 78 | C-1 | 22 | — | | — | | — | |
| Comparative Example 2 | A-1 | 90 | — | | C-1 | 10 | — | | — | | — | |
| Comparative Example 3 | A-1 | 90 | B-1 | 10 | — | | — | | — | | — | |

| | Dielectric constant properties | | Developability | | Adhesion | |
|---|---|---|---|---|---|---|
| | Dielectric constant Dk | Dielectric Dissipation factor Df | Unexposed part | Exposed part | Copper foil | Glass |
| Example 1 | 2.6 | 0.0021 | ○ | ○ | 100/100 | 100/100 |
| Example 2 | 2.6 | 0.0022 | ○ | ○ | 100/100 | 100/100 |
| Example 3 | 2.6 | 0.0025 | ○ | ○ | 100/100 | 100/100 |
| Example 4 | 2.5 | 0.0019 | ○ | ○ | 100/100 | 100/100 |
| Example 5 | 2.6 | 0.0019 | ○ | ○ | 100/100 | 100/100 |
| Example 6 | 2.5 | 0.0021 | ○ | ○ | 100/100 | 100/100 |
| Example 7 | 2.5 | 0.0020 | ○ | ○ | 100/100 | 100/100 |
| Example 8 | 2.4 | 0.0020 | ○ | ○ | 100/100 | 100/100 |
| Example 9 | 2.5 | 0.0018 | ○ | ○ | 100/100 | 100/100 |
| Example 10 | 2.6 | 0.0020 | ○ | ○ | 100/100 | 100/100 |
| Example 11 | 2.5 | 0.0018 | ○ | ○ | 100/100 | 100/100 |
| Example 12 | 2.5 | 0.0020 | ○ | ○ | 100/100 | 100/100 |
| Example 13 | 2.5 | 0.0019 | ○ | ○ | 100/100 | 100/100 |
| Example 14 | 2.5 | 0.0019 | ○ | ○ | 100/100 | 100/100 |
| Example 15 | 2.5 | 0.0021 | ○ | ○ | 100/100 | 100/100 |
| Example 16 | 2.5 | 0.0019 | ○ | ○ | 100/100 | 100/100 |
| Example 17 | 2.5 | 0.0018 | ○ | ○ | 100/100 | 100/100 |
| Example 18 | 2.6 | 0.0024 | ○ | ○ | 100/100 | 100/100 |
| Example 19 | 2.5 | 0.0019 | ○ | ○ | 100/100 | 100/100 |
| Example 20 | 2.5 | 0.0024 | ○ | ○ | 100/100 | 100/100 |
| Comparative Example 1 | Not formed into film | | ○ | ○ | 13/100 | 0/0 |
| Comparative Example 2 | 2.4 | 0.0018 | ○ | x | 100/100 | 100/100 |
| Comparative Example 3 | 2.5 | 0.0030 | ○ | x | 100/100 | 100/100 |

The abbreviations shown in Table 1 indicate the following compounds.

<Polyimide Resin (A)>
A-1-polyimide resin of Production Example 1
A-2-polyimide resin of Production Example 2
A-3-polyimide resin of Production Example 3

<Maleimides (B)>
B-1-4,4-diphenylmethanebismaleimide (product name: "BMI-1000H," commercially available from Daiwa Fine Chemicals Co., Ltd.)

B-2-bismaleimide of the following Formula (3) (product name: "BMI-689," commercially available from Designer Molecule Inc.)

B-3-bismaleimide of the following Formula (4) (product name: "BMI-1700," commercially available from Designer Molecule Inc.)

<Polyfunctional Polymerizable Compound (C)>
C-1-butadiene-styrene polymer (product name: "Ricon100," commercially available from Cray Valley, number average molecular weight: 4500)

C-2-butadiene-styrene polymer (product name: "Ricon184," commercially available from Cray Valley, number average molecular weight: 8600)

C-3-epoxidized polybutadiene (product name: "NISSO-PB JP-200," commercially available from Nippon Soda Co., Ltd.)

C-4-1,2-butadiene homopolymer (product name: "NISSO-PB B-1000," commercially available from Nippon Soda Co., Ltd., number average molecular weight: 1200)

<Amine Compound>

D-1-N-2-(aminoethyl)-3-aminopropyltrimethoxysilane (product name: "KBM-603," commercially available from Shin-Etsu Chemical Co., Ltd.)

D-2-2-methylimidazole (product name: "Curezol 2MZ-H," commercially available from Shikoku Chemical Corporation)

D-3-2-ethylhexanoate of diazabicycloundecane (product name: "U-CAT SA102," commercially available from San-Apro Ltd.)

<Photopolymerization Initiator>

DETX-2,4-diethylthioxanthen-9-one (product name: "Omnirad DETX," commercially available from IGM Resin)

Production Example 4

70.0 g of 6FDA, 130.5 g of methyl isobutyl ketone and 130.5 g of methylcyclohexane were put into the same reaction container as in Production Example 1 and heated to 70° C. Then, 78.1 g of a dimer diamine (product name: "PRIAMINE1075," commercially available from Croda Japan; hereinafter referred to as PRIAMINE1075) was gradually added thereto and then heated to 110° C. and subjected to an imidization reaction over 15 hours to obtain a solution of a polyimide resin (A-4) (a non-volatile content of 35%).

Production Example 5

After the solution of the polyimide resin (A-4) (a non-volatile content of 35%) was produced by the method of Production Example 4, 400.0 g of the solution, 12.69 g of cyclopentanone and 6.76 g of N,N'-diallyl-N"-monoglycidyl isocyanurate (product name: "DA-MGIC," commercially available from Shikoku Chemical Corporation) were added and heated to 120° C. and reacted over 7 hours to obtain a solution of a polyimide resin (A-5) (a non-volatile content of 35%).

Example 21

10.0 g of the solution of the polyimide resin (A-4) (non-volatile content: 3.5 g) as the component (A), 0.24 g of BMI-689 (non-volatile content: 0.24 g) as the component (B), 0.15 g of a butadiene-styrene polymer (product name:

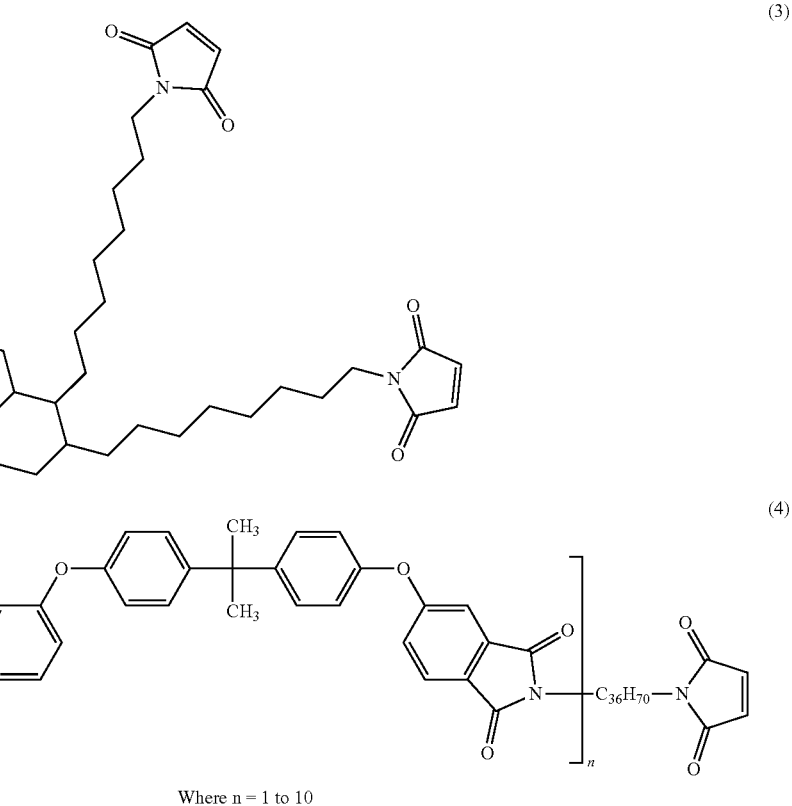

"Ricon184," commercially available from Cray Valley) (non-volatile content: 0.15 g) as the component (C), 0.06 g of epoxidized polybutadiene (product name: "NISSO-PB JP-200," commercially available from Nippon Soda Co., Ltd.) (non-volatile content: 0.06 g), 0.04 g of 2,4-diethyl-thioxanthen-9-one (product name: "Omnirad DETX," commercially available from IGM Resin) as the photopolymerization initiator and 0.91 g of cyclopentanone were mixed and thoroughly stirred to obtain a curable photosensitive resin composition having a non-volatile content of 35%.

Examples 22 to 26 and Comparative Examples 4 to 6

Curable photosensitive resin compositions were obtained in the same manner as in Example 21 according to the compositions shown in Table 2.

(Dielectric Constant and Dielectric Dissipation Factor)

Cured products were prepared in the same method as described above using curable photosensitive resin compositions of Examples 21 to 26 and Comparative Examples 4 to 6, and the dielectric constant and the dielectric dissipation factor were measured. In addition, the same applied to the photosensitive resin composition of Example 19. The results are shown in Table 2 (the same hereinafter).

(Adhesion)

The curable photosensitive resin composition of Example 19 was applied to a commercially available electrolytic copper foil (product name "F2-WS," commercially available from Furukawa Electric Co., Ltd.) (a thickness of 18 μm) so that the thickness of the cured product layer after development was 10 μm and dried at 120° C. for 5 minutes to obtain a laminate (2). Then, a part of the cured product layer was covered with a test target (product name: "TRP-003," commercially available from Sigmakoki Co., Ltd., 5 cm×5 cm) and exposed to ultraviolet rays from a UV LED lamp having a wavelength of 365 nm (200 mW/cm$^2$, 1800 mJ/cm$^2$) and then immersed in cyclopentanone having a non-volatile content concentration of 100% for 1 minute, and the light-blocked unexposed part was removed (the part remaining after removal is called an exposed part). The adhesion between the copper foil and the exposed part of the cured product layer was evaluated by a cross-cut method according to JIS-K 5600-5-6: 1999. In addition, for the curable photosensitive resin compositions of Examples 21 to 26 and Comparative Examples 4 to 6, the adhesion was evaluated by the same method. Here, the curable photosensitive resin composition of Example 23 was also evaluated under the condition in which the thickness of the cured product layer after development was 2.5 μm (shown as Example 23-2 in Table 2 (the same hereinafter)).

Regarding the adhesion in the previous paragraph, a laminate (2) was prepared in the same manner by replacing the electrolytic copper foil with a commercially available glass (commercially available from Nippon Test Panel Co., Ltd.), a commercially available silicon wafer (commercially available from AKD), and a silicon wafer on which a 150 μm copper layer was formed by a sputtering treatment and evaluated in the same manner. Here, regarding the silicon wafer on which the copper layer was formed, the curable photosensitive resin composition was applied to the side of the copper layer to prepare a laminate (2).

(Resolution)

The curable photosensitive resin composition of Example 19 was applied to a commercially available silicon wafer (commercially available from AKD) so that the thickness of the cured product layer after development was 10 μm and dried at 120° C. for 5 minutes to obtain a laminate (3). Then, a part of the cured product layer was covered with a test target (product name: "TRP-003," commercially available from Sigmakoki Co., Ltd., 5 cm×5 cm) and exposed to ultraviolet rays from a UV LED lamp having a wavelength of 365 nm (200 mW/cm$^2$, 1,800 mJ/cm$^2$) and then additionally dried at 150° C. for 5 minutes. Then, the sample was immersed in cyclopentanone having a non-volatile content concentration of 100% for 1 minute, and the half-exposed part was removed. The line width (unit: μm) of the formed minimum line/space was measured, and the measured value (line width) was evaluated as the resolution. In addition, for the curable photosensitive resin compositions of Examples 21 to 26 and Comparative Examples 4 to 6, laminates (3) were prepared in the same method, and the adhesion was evaluated. Here, the curable photosensitive resin composition of Example 23 was also evaluated under the condition in which the thickness of the cured product layer after development was 2.5 μm. A smaller numerical value indicates a higher resolution.

TABLE 2

| | Polyimide resin (wt %) | | Maleimides (wt %) | | | | Polyfunctional polymerizable compound (wt %) | | | | Photopolymerization initiator (wt %) | | | | Dielectric constant Dk | Dielectric Dissipation factor Df |
|---|---|---|---|---|---|---|---|---|---|---|---|---|---|---|---|---|
| Example 19 | A-1 | 87.9 | B-2 | 6.0 | — | | C-2 | 3.8 | C-3 | 1.3 | DETX | 1 | — | | 2.5 | 0.0019 |
| Example 21 | A-4 | 87.9 | B-2 | 6.1 | — | | C-2 | 3.8 | C-3 | 1.4 | DETX | 1 | — | | 2.5 | 0.0020 |
| Example 22 | A-4 | 88.9 | B-2 | 6.8 | — | | C-5 | 2.1 | C-3 | 1.2 | DETX | 1 | — | | 2.3 | 0.0023 |
| Example 23 | A-4 | 79.1 | B-2 | 11.2 | — | | C-5 | 3.9 | C-6 | 3.8 | DETX | 2 | — | | 2.4 | 0.0022 |
| Example 23-2 | A-4 | 79.1 | B-2 | 11.2 | — | | C-5 | 3.9 | C-6 | 3.8 | DETX | 2 | — | | 2.4 | 0.0022 |
| Example 24 | A-4 | 64.7 | B-2 | 12.5 | B-4 | 3.1 | C-5 | 14.5 | C-6 | 3.1 | DETX | 2 | — | | 2.5 | 0.0023 |
| Example 25 | A-4 | 63.4 | B-2 | 12.3 | B-4 | 3.1 | C-5 | 14.2 | C-6 | 3.1 | DETX | 2 | Omni907 | 2 | 2.5 | 0.0024 |
| Example 26 | A-5 | 82.6 | B-2 | 11.2 | — | | C-5 | 3.9 | — | | DETX | 2 | — | | 2.4 | 0.0021 |
| Comparative Example 4 | A-4 | 79.1 | — | | — | | — | | 15.1 | C-6 | 3.8 | DETX | 2 | — | | 2.4 | 0.0020 |
| Comparative Example 5 | A-4 | 79.1 | — | | — | | — | | 15.1 | C-6 | 3.8 | DETX | 2 | — | | 2.4 | 0.0020 |
| Comparative Example 6 | A-4 | 79.1 | B-2 | 18.9 | — | | — | | — | | DETX | 2 | — | | — | 0.0032 |

TABLE 2-continued

| | | Film thickness after development μm | Resolution μm | Adhesion | | | |
|---|---|---|---|---|---|---|---|
| | | | | Copper foil | Glass | Silicon wafer | Silicon wafer on which copper layer was formed |
| | Example 19 | 10 | 30 | 100/100 | 100/100 | 100/100 | 100/100 |
| | Example 21 | 10 | 25 | 100/100 | 100/100 | 100/100 | 100/100 |
| | Example 22 | 10 | 20 | 100/100 | 100/100 | 100/100 | 100/100 |
| | Example 23 | 10 | 20 | 100/100 | 100/100 | 100/100 | 100/100 |
| | Example 23-2 | 2.5 | 3 | 100/100 | 100/100 | 100/100 | 100/100 |
| | Example 24 | 10 | 20 | 100/100 | 100/100 | 100/100 | 100/100 |
| | Example 25 | 10 | 15 | 100/100 | 100/100 | 100/100 | 100/100 |
| | Example 26 | 10 | 20 | 100/100 | 100/100 | 100/100 | 100/100 |
| | Comparative Example 4 | 10 | Film was dissolved | | Unable to test | | |
| | Comparative Example 5 | 10 | Film was dissolved | | Unable to test | | |
| | Comparative Example 6 | 10 | Film was dissolved | | Unable to test | | |

The abbreviations shown in Table 2 indicate the following compounds.

<Polyimide Resin (A)>
  A-4-polyimide resin of Production Example 4
  A-5-polyimide resin of Production Example 5
<Maleimides>
  B-2-bismaleimide of Formula (3) (product name: "BMI-689," commercially available from Designer Molecule Inc.)
  B-4-N-phenylmaleimide (product name: "IMILEX-P," commercially available from Nippon Shokubai Co., Ltd.)
<Polyfunctional Polymerizable Compound>
  C-2-butadiene-styrene polymer (product name: "Ricon184," commercially available from Cray Valley, number average molecular weight: 8600)
  C-3-epoxidized polybutadiene (product name: "NISSO-PB JP-200," commercially available from Nippon Soda Co., Ltd.)
  C-5-butadiene-styrene polymer (product name: "Ricon181," commercially available from Cray Valley, number average molecular weight: 3200)
  C-6-N,N'-diallyl-N"-monoglycidyl isocyanurate (product name: "DA-MGIC," commercially available from Shikoku Chemical Corporation)
<Photopolymerization Initiator>
  DETX-2,4-diethylthioxanthen-9-one (product name: "Omnirad DETX," commercially available from IGM Resin)
  Omni907-2-methyl-1-(4-methylthiophenyl)-2-morpholino-1-propanone (product name: "Omnirad 907," commercially available from IGM Resin)

What is claimed is:

1. A curable photosensitive resin composition, comprising:
  a polyimide resin (A) which is a reaction product of monomer groups containing an aromatic tetracarboxylic anhydride (a1) and a diamine (a2) containing a dimer diamine;
  maleimides (B); and
  a polyfunctional polymerizable compound (C) having two or more ethylenic double bonds other than the component (A) and the component (B),
  wherein the component (C) contains a polymer having a diene framework.

2. The curable photosensitive resin composition according to claim 1,
  wherein the component (B) is N,N'-diphenylbismaleimides and/or maleimides having a dimer diamine framework.

3. The curable photosensitive resin composition according to claim 1, further comprising an amine compound (D) other than the component (a2).

4. A cured product of the curable photosensitive resin composition according to claim 1.

5. A resist pattern having a pattern,
  wherein the pattern contains the cured product according to claim 4.

6. A semiconductor device comprising the resist pattern according to claim 5.

7. An electronic device comprising the semiconductor device according to claim 6.

8. A method of producing a resist pattern, comprising:
  a process of providing a layer of the cured product according to claim 4 on a support; and
  a process of mounting a photoresist on the layer of the cured product to form a pattern and then performing cutting to remove the layer of the cured product, and forming a resist pattern.

9. A method of producing a resist pattern, comprising:
  a process of providing a layer of the curable photosensitive resin composition according to claim 1 on a support;
  a process of exposing the layer of the curable photosensitive resin composition by active energy rays to photocure an exposed part; and
  a process of removing an unexposed part to form a resist pattern.

* * * * *